United States Patent
Peng et al.

(10) Patent No.: US 6,992,017 B2
(45) Date of Patent: Jan. 31, 2006

(54) PROCESS FOR CLEANING SILICON SURFACE AND FABRICATION OF THIN FILM TRANSISTOR BY THE PROCESS

(75) Inventors: Chia-Tien Peng, Jubei (TW); Ming-Wei Sun, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 78 days.

(21) Appl. No.: 10/409,985

(22) Filed: Apr. 8, 2003

(65) Prior Publication Data

US 2004/0127032 A1 Jul. 1, 2004

(30) Foreign Application Priority Data

Dec. 31, 2002 (TW) ............... 91138123 A

(51) Int. Cl.
  H01L 21/465 (2006.01)
  C25F 3/30 (2006.01)
(52) U.S. Cl. .................. 438/749; 134/1.3
(58) Field of Classification Search ........ 438/472, 438/690, 694, 699, 745, 746, 747, 749, 753; 134/1.3
  See application file for complete search history.

(56) References Cited

U.S. PATENT DOCUMENTS

| | | | |
|---|---|---|---|
| 4,693,759 A * | 9/1987 | Noguchi et al. ........... 117/8 |
| 5,346,833 A * | 9/1994 | Wu ................ 438/30 |
| 5,656,097 A * | 8/1997 | Olesen et al. ............ 134/1 |
| 5,954,885 A * | 9/1999 | Ohmi ................. 134/1.3 |
| 6,099,662 A * | 8/2000 | Wang et al. ............. 134/26 |
| 6,240,933 B1 | 6/2001 | Bergman .............. 134/1.3 |
| 6,332,835 B1 * | 12/2001 | Nishimura et al. .......... 451/67 |
| 6,346,505 B1 | 2/2002 | Morita et al. .......... 510/175 |
| 6,348,157 B1 | 2/2002 | Ohmi et al. .......... 210/760 |
| 6,500,736 B2 | 12/2002 | Kim et al. ............ 438/486 |
| 6,559,036 B1 | 5/2003 | Ohtani et al. .......... 438/486 |
| 6,627,001 B2 * | 9/2003 | Chen ................ 134/3 |
| 6,689,645 B2 * | 2/2004 | Houng et al. ........... 438/143 |
| 2001/0017143 A1 | 8/2001 | Bergman ............. 134/3 |
| 2002/0005214 A1 * | 1/2002 | Tomita et al. .......... 134/36 |
| 2002/0102775 A1 * | 8/2002 | Houng et al. .......... 438/143 |
| 2002/0137266 A1 | 9/2002 | Moon et al. ........... 438/166 |
| 2002/0173173 A1 * | 11/2002 | Kobayashi et al. ........ 438/795 |
| 2003/0000548 A1 * | 1/2003 | Tsuga et al. .......... 134/1.3 |
| 2004/0106240 A1 | 6/2004 | Peng et al. ............ 438/166 |

FOREIGN PATENT DOCUMENTS

TW   426874   3/2001
TW   464972   11/2001

* cited by examiner

*Primary Examiner*—Craig A. Thompson
*Assistant Examiner*—Jennifer M. Dolan
(74) *Attorney, Agent, or Firm*—Ladas & Parry LLP

(57) ABSTRACT

A process for cleaning a silicon surface. First, a silicon surface is cleaned with an oxidant solution. Next, the silicon surface is rinsed with HF vapor or liquid and then with the silicon surface with hydrogen water or deionized water under megasonic agitation. Finally, the silicon surface is cleaned with an oxidant solution a second time. The present inventive cleaning process can be applied in thin film transistor (TFT) fabrication and the TFT obtained has higher electron mobility.

23 Claims, 9 Drawing Sheets

PROCESS FOR CLEANING SILICON SURFACE AND FABRICATION OF THIN FILM TRANSISTOR BY THE PROCESS

BACKGROUND OF THE INVENTION

1. Field of the Invention

The present invention relates to a process for cleaning a silicon surface, and more particularly to a process for cleaning a silicon surface in the TFT fabrication process for a TFT-LCD.

2. Description of the Prior Art

In the semiconductor IC and TFT-LCD array fabrication processes, the result of cleaning a silicon material plays an important role in the ultimate quality of IC devices and TFT arrays.

In the semiconductor IC fabrication process, Caros ($H_2SO_4/H_2O_2$), SC1 (standard clean 1; $NH_4OH/H_2O_2$) and SC2 (standard clean 2; $HCl/H_2O_2$) cleaning methods have been extensively used for cleaning silicon wafers. These cleaning methods produce good cleaning results, but suffer from requiring a large amount of chemicals, resulting in environmental problems and additional treatment costs. In addition, ozone and HF have also been used to clean silicon wafers. For example, in U.S. Patent Application Publication No. 2001/0017143 A1, ozone water and HF are used to clean semiconductor silicon wafers. In U.S. Pat. No. 6,240,933, the semiconductor silicon wafer is first cleaned with ozone water and then the oxide is removed by vapor. In U.S. Pat. No. 6,348,157, the semiconductor is cleaned using ozone water, HF (with megasonic), deionized water (DIW), HF and DIW in sequence.

In the amorphous TFT-LCD fabrication process, amorphous silicon cleaning is conducted using CJ (cavitation-jet), a brush, ozone water, or UV ozone. CJ and brush cleaning are ineffective on particles smaller than 1 μm. If the ozone water concentration is too low (<10 ppm), the cleaning is ineffective. UV ozone provides a relatively good rate of removal for organic material, but a relatively poor rate of removal for metal contaminants.

Polysilicon TFT has higher electron mobility, quicker response time, and higher resolution than amorphous TFT. Therefore, polysilicon TFT has been extensively applied to drive LCDs. Generally, polysilicon TFT fabrication uses a low temperature polysilicon (LTPS) process. That is, amorphous silicon is first formed, and is then subjected to laser annealing to form polysilicon.

There is a need to develop an effective cleaning process for silicon wafer in semiconductor IC and for amorphous silicon and polysilicon in TFT-LCDs.

SUMMARY OF THE INVENTION

An object of the present invention is to solve the above-mentioned problems and provide a process for cleaning a silicon surface. The present cleaning process is suitable for all silicon materials including monocrystalline silicon wafer, amorphous silicon, and polysilicon. The present cleaning process provides effective results and the TFT achieves higher electron mobility.

To achieve the above object, the inventive process for cleaning a silicon surface includes the following steps. First, a silicon surface is cleaned with an oxidant solution. Next, the silicon surface is rinsed with HF vapor or liquid and then with hydrogen water or deionized water under megasonic agitation. Finally, the silicon surface is cleaned with an oxidant solution for a second time.

According to an embodiment of the present invention, the inventive cleaning process can be applied to silicon material cleaning in TFT fabrication and includes the following steps. An amorphous silicon layer is formed on a substrate as an active layer. Next, a surface of the amorphous silicon layer is cleaned. Next, a gate dielectric layer, a gate, a source region, and a drain region are formed. The feature of the present invention resides in cleaning of the amorphous silicon layer surface and the cleaning includes the following steps. First, the amorphous silicon surface is cleaned with an oxidant solution for the first time. Next, the amorphous silicon surface is rinsed with HF vapor or liquid and then rinsed with hydrogen water or deionized water under megasonic agitation. Finally, the amorphous silicon surface is cleaned with an oxidant solution for a second time.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a cleaning process for silicon surface. First, a silicon surface is cleaned with an oxidant solution for a first time. Then, the silicon surface is rinsed with HF vapor or liquid. Then, the silicon surface is rinsed with hydrogen water or deionized water under megasonic agitation. Finally, the silicon surface is cleaned with an oxidant solution for the second time.

The present inventive cleaning is suitable for various silicon materials, including mono-crystalline silicon wafer, amorphous silicon, and polysilicon. For example, the present invention is suitable for cleaning mono-crystalline silicon wafer, amorphous silicon, or polysilicon in the semiconductor IC fabrication process, and amorphous silicon or polysilicon in the TFT-LCD fabrication process.

Figure 1:
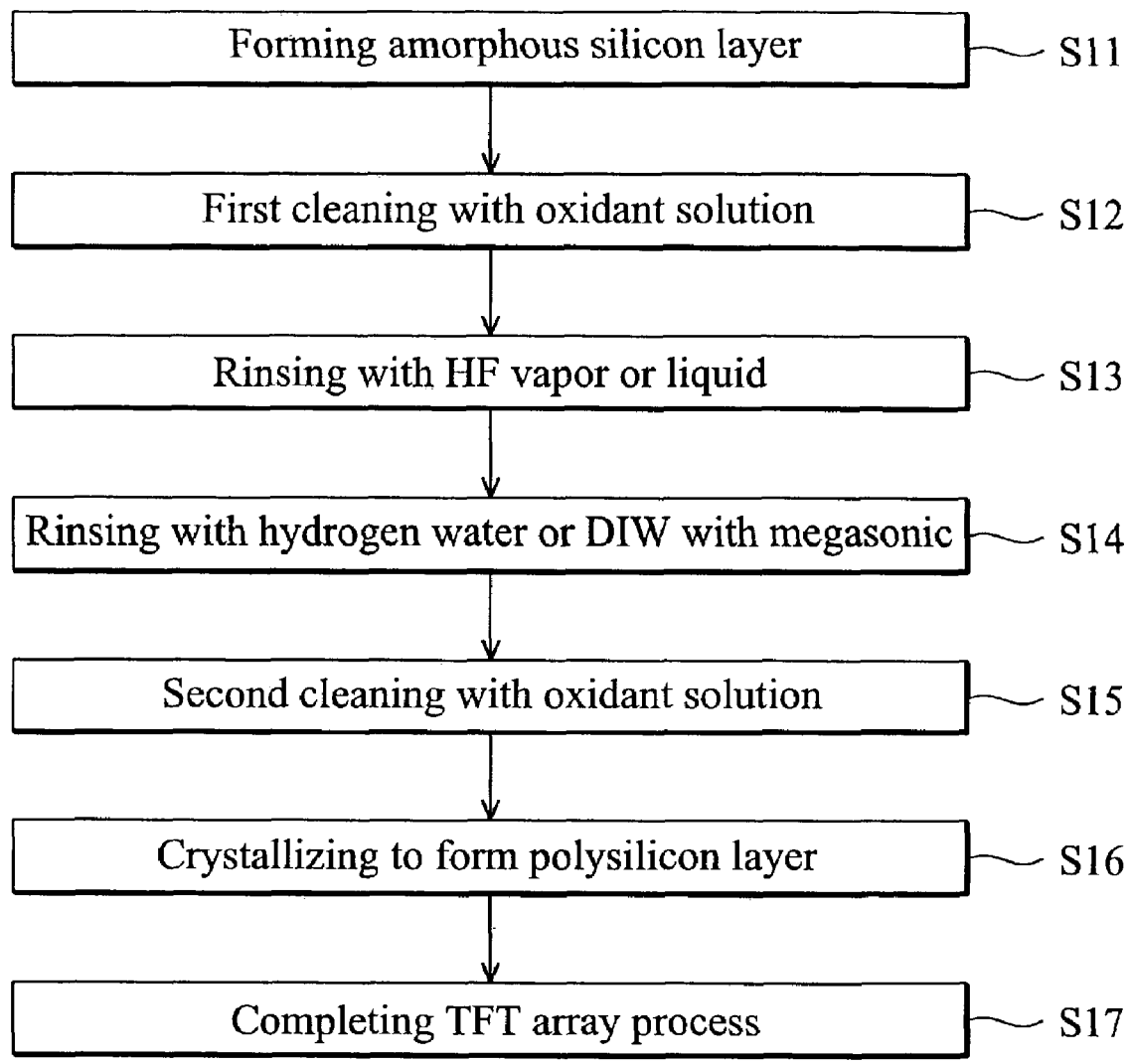
FIG. 1 is a flowchart illustrating the cleaning process for an amorphous silicon layer in the polysilicon TFT fabrication process.

FIG. 1 is a flowchart illustrating the cleaning process for an amorphous silicon layer in the polysilicon TFT fabrication process. FIGS. 2a to 2i are cross-sections illustrating the process flow of fabricating a top-gate polysilicon TFT array according to a preferred embodiment of the present invention.

Figure 2A:
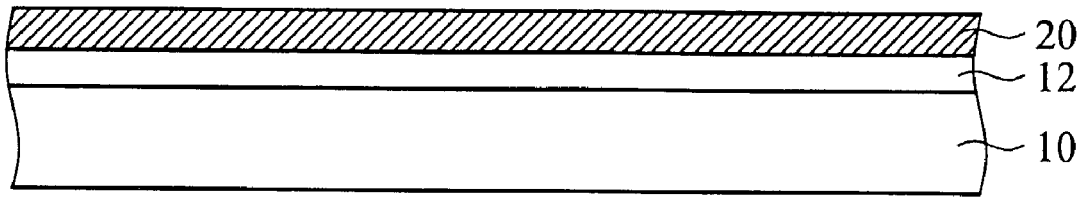
FIGS. 2a to 2i are cross-sections illustrating the process flow of fabricating a top-gate polysilicon TFT array according to a preferred embodiment of the present invention.

In FIGS. 1 and 2a, a buffer insulating layer 12 and an amorphous silicon layer 20 are formed sequentially on a substrate 10 (step S11). The substrate 10 can be a transparent substrate such as glass or plastic. The buffer insulating layer 12 can be a silicon nitride layer or silicon oxide layer, or, alternatively, can include two layers: a combination of a silicon nitride and silicon oxide layers. The amorphous silicon layer can be formed by plasma-enhanced chemical vapor deposition (PECVD) or low pressure chemical vapor deposition (LPCVD) using silane ($SiH_4$) as reactant gas. After the amorphous silicon layer 20 is formed, dehydration is performed.

Subsequently, the inventive cleaning (steps S12 to S15) is conducted. The surface of the amorphous silicon layer is cleaned with an oxidant solution for the first time (step S12). Cleaning with the oxidant solution oxidizes the surface of the amorphous silicon layer, forming native oxide. Thus, organic contaminants and metal ion contaminants can be trapped in the native oxide. The oxidant solution can be an ozone-containing aqueous solution or hydrogen peroxide ($H_2O_2$). When the ozone-containing aqueous solution is used, it can have a concentration of 15 to 30 ppm. The oxidant solution can further include HCl in a concentration of 15 to 30 ppm, which increases the metal removal efficiency.

Subsequently, the silicon surface is rinsed with HF vapor or liquid (step S13). The HF vapor or liquid can have a concentration of 0.5 to 2 weight %. Cleaning with HF can remove the native oxide on the amorphous silicon layer surface. Thus, organic and metal ion contaminants trapped in native oxide can be removed in turn.

Subsequently, the silicon surface is rinsed with hydrogen water or deionized water under megasonic agitation (step S14) to shake off particles. The hydrogen water or deionized water can further include an alkaline component such as $NH_4OH$ in order to increase the particles removal efficiency.

Subsequently, the silicon surface is cleaned with an oxidant solution for the second time (step S15). The oxidant solution for the second cleaning can be the same as or different from the oxidant solution for the first cleaning. The second cleaning with oxidant solution causes dangling bonds on the amorphous silicon surface to be passivated.

In the above-mentioned cleaning steps S12 to S15, cleaning with all the cleaning reagents including oxidant solution, HF liquid, hydrogen water, and deionized water can be performed by spraying the cleaning reagent on silicon material or immersing silicon material in the cleaning reagent.

Figure 2B:
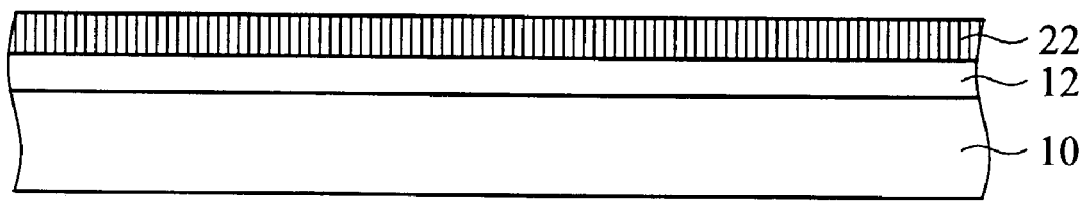

Subsequently, referring to FIGS. 1 and 2b, the amorphous silicon layer 20 is crystallized by a method, such as, excimer laser annealing (ELA) to form a polysilicon layer 22.

Finally, the remaining steps of the TFT array process are conducted to complete the TFT array fabrication, thus obtaining a polysilicon TFT array (step S17).

Figure 2C:
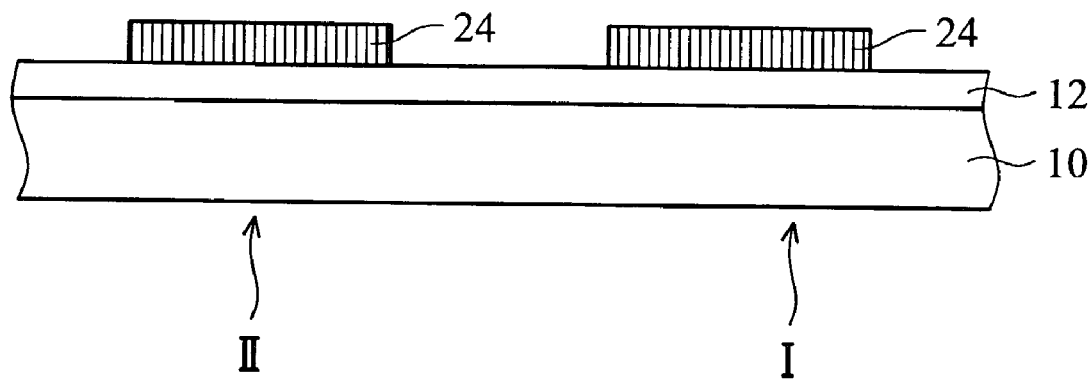

The rest of the TFT array process is explained in FIGS. 2c to 2i. Referring to FIG. 2c, the polysilicon layer 22 is patterned by photolithography and etching to form a polysilicon layer 24 divided into regions I and II.

Figure 2D:
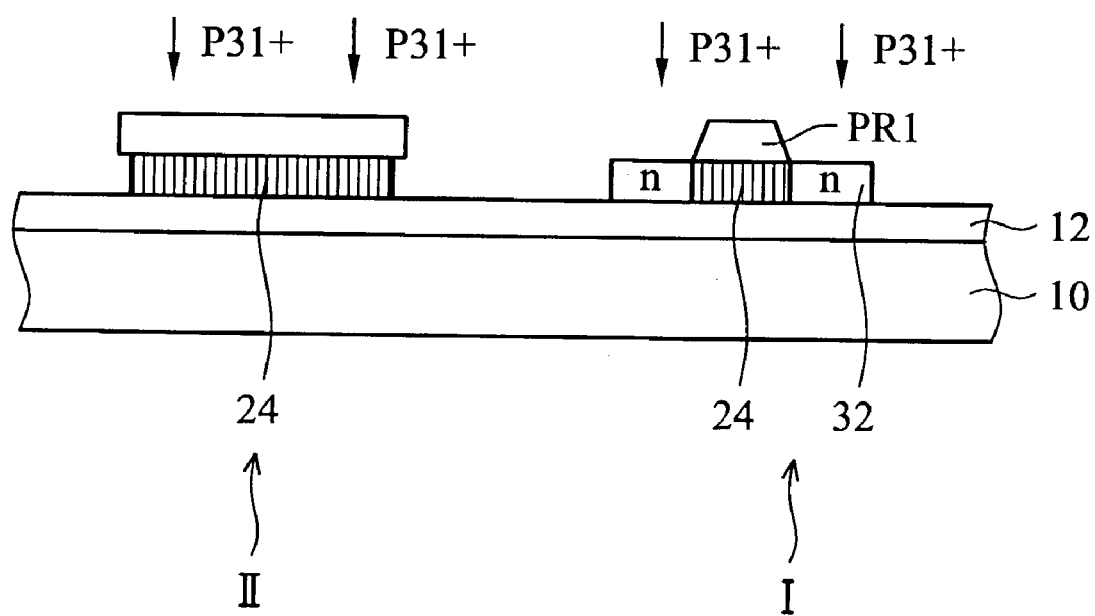
Figure 2E:
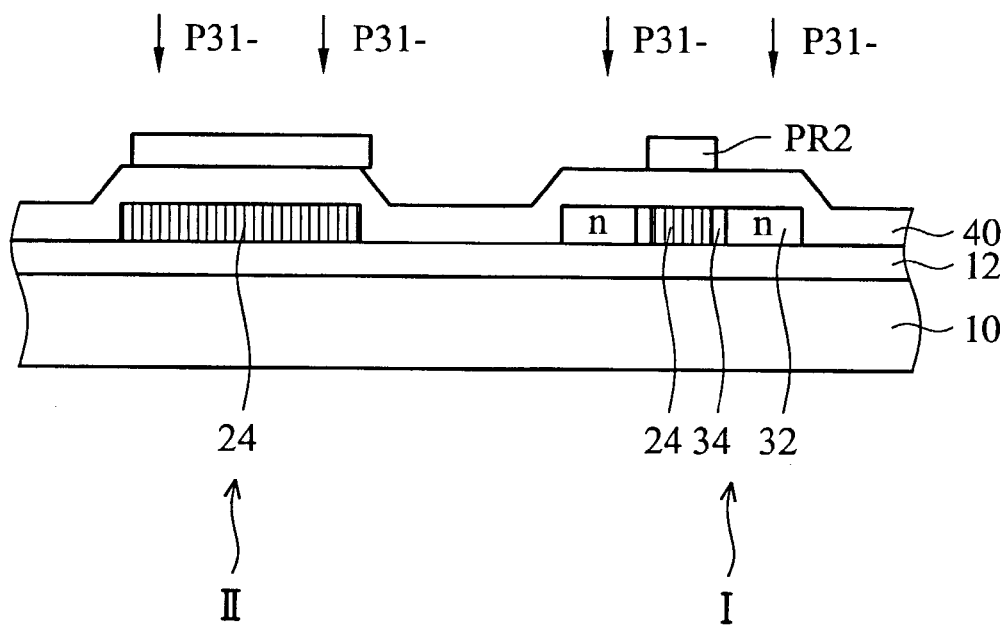

Subsequently, referring to FIG. 2d, a photoresist pattern PR1 is formed and then the polysilicon layer 24 is heavily doped with phosphorus using the photoresist pattern PR1 as a mask, forming an n-type source/drain region 32 in region I. Next, referring to FIG. 2e, the photoresist pattern PR1 is removed, and then a gate dielectric layer 40 and a photoresist pattern PR2 are formed. The polysilicon layer 24 is lightly doped with phosphorus using the photoresist pattern PR2 as a mask, forming a lightly-doped drain (LDD) 34 at the inner side of the n-type source/drain region 32 in region I.

Figure 2F:
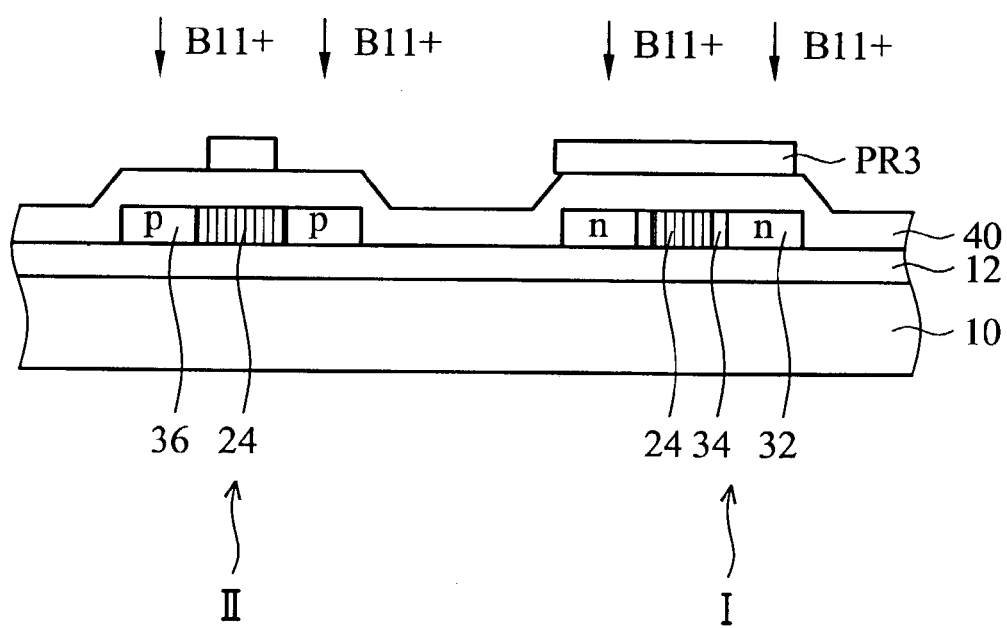

Subsequently, referring to FIG. 2f, the photoresist pattern PR2 is removed and then a photoresist pattern PR3 is formed. The polysilicon layer 24 is heavily doped with boron using the photoresist pattern PR3 as a mask, forming a p-type source/drain region 36 in region II.

Figure 2G:
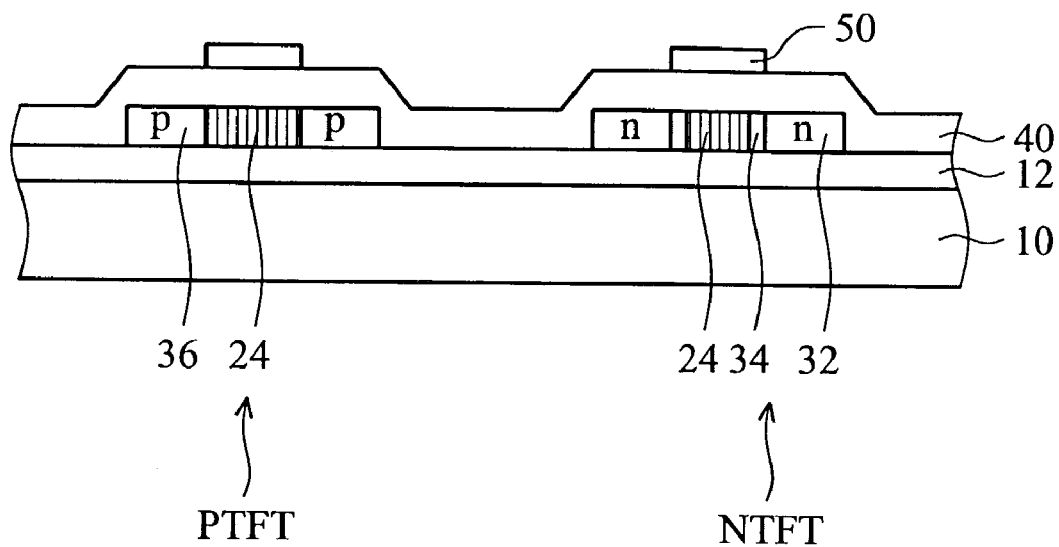

Subsequently, referring to FIG. 2g, the photoresist pattern PR3 is removed. Next, a metal layer (not shown) is formed on the gate dielectric layer 40 and then subjected to photolithography and etching to form a gate layer 50 at the position corresponding to the polysilicon layer 24. Thus far, region I forms NTFT, and region II forms PTFT.

Figure 2H:
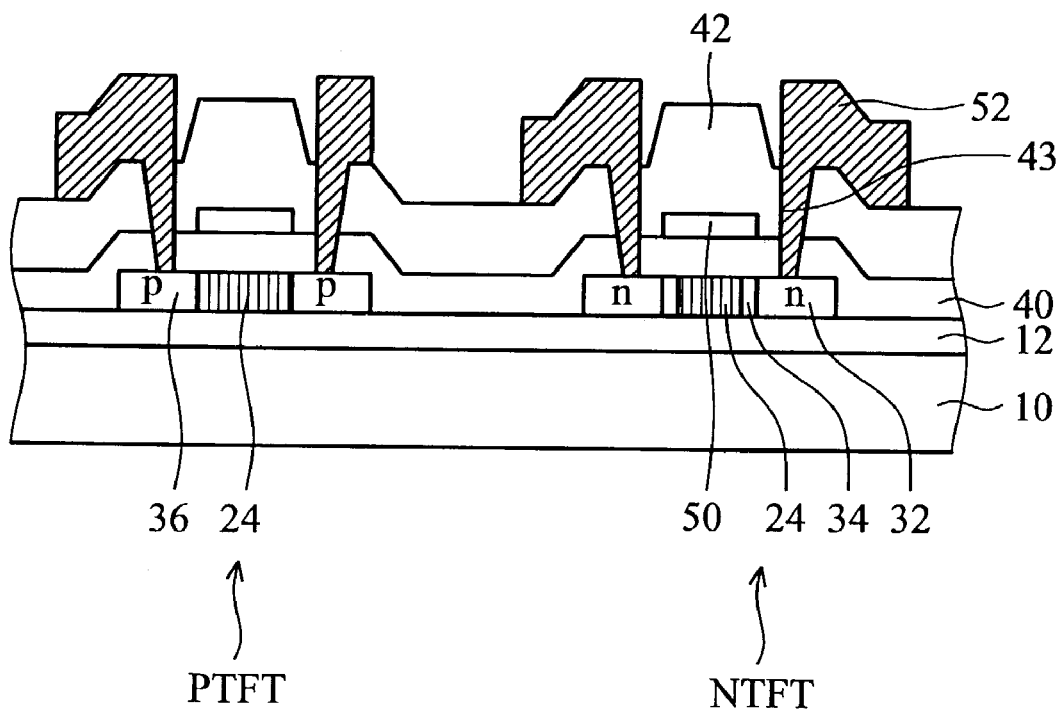

Subsequently, referring to FIG. 2h, an interlayer dielectric layer 42 is formed and then a first opening 43 reaching the source/drain regions 32 and 36 is formed in the interlayer dielectric layer. Next, metal is filled in the first opening 43 to form a source/drain electrode 52.

Figure 2I:
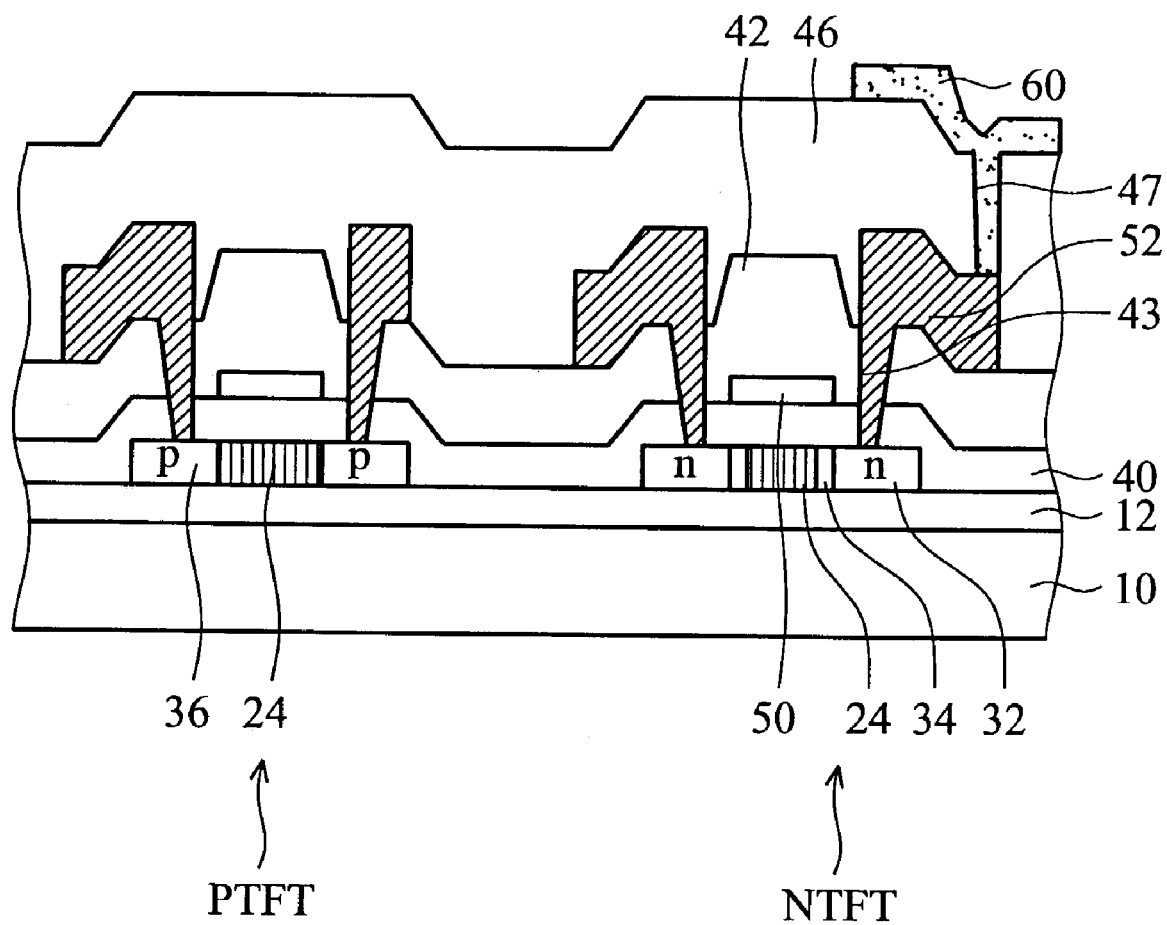

Subsequently, referring to FIG. 2i, a passivation layer 46 is formed and then a second opening 47 reaching the drain electrode 52 of NTFT is formed in the passivation layer 46. Next, a pixel electrode 60 such as indium-tin-oxide (ITO) is filled in the second opening 47. Thus far, TFT array fabrication is completed, obtaining the TFT array as shown in FIG. 2i. The TFT array can be combined with a front transparent substrate (such as a color filter substrate) and liquid crystal to make up a TFT-LCD panel.

Figure 3:
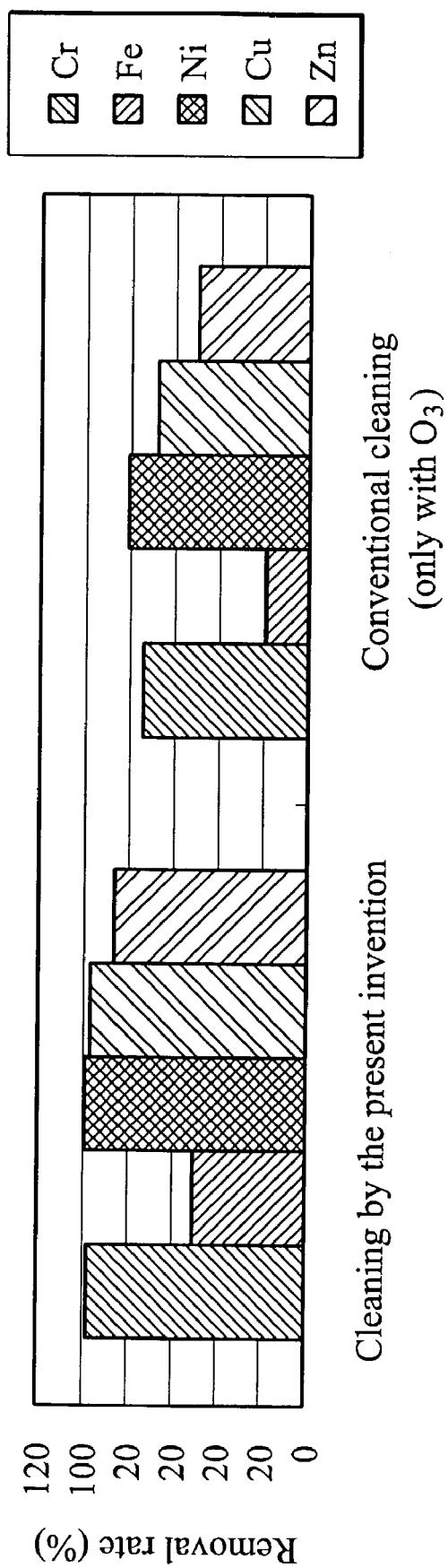
FIG. 3 is a comparison on the removal rate for different metal ions on a silicon wafer between the present inventive cleaning and conventional cleaning.

In the following descriptions, the removal rate for different metal ions on silicon wafer between the present inventive cleaning (with $O_3$ and HF) and conventional cleaning (only with $O_3$) is compared. Silicon wafers are immersed in various 20 ppm metal ion solutions and then dried to change the metal ion concentration to about $10^{13}$ atom/$cm^2$. The silicon wafer having metal ions on the surface is subjected to the present inventive cleaning and the conventional cleaning respectively and then the metal ion concentration is determined to obtain the removal rate for different metal ions as shown in FIG. 3. It can be seen from FIG. 3 that the removal rate for various metal ions by the present inventive cleaning surpasses the conventional cleaning.

Figure 4A:
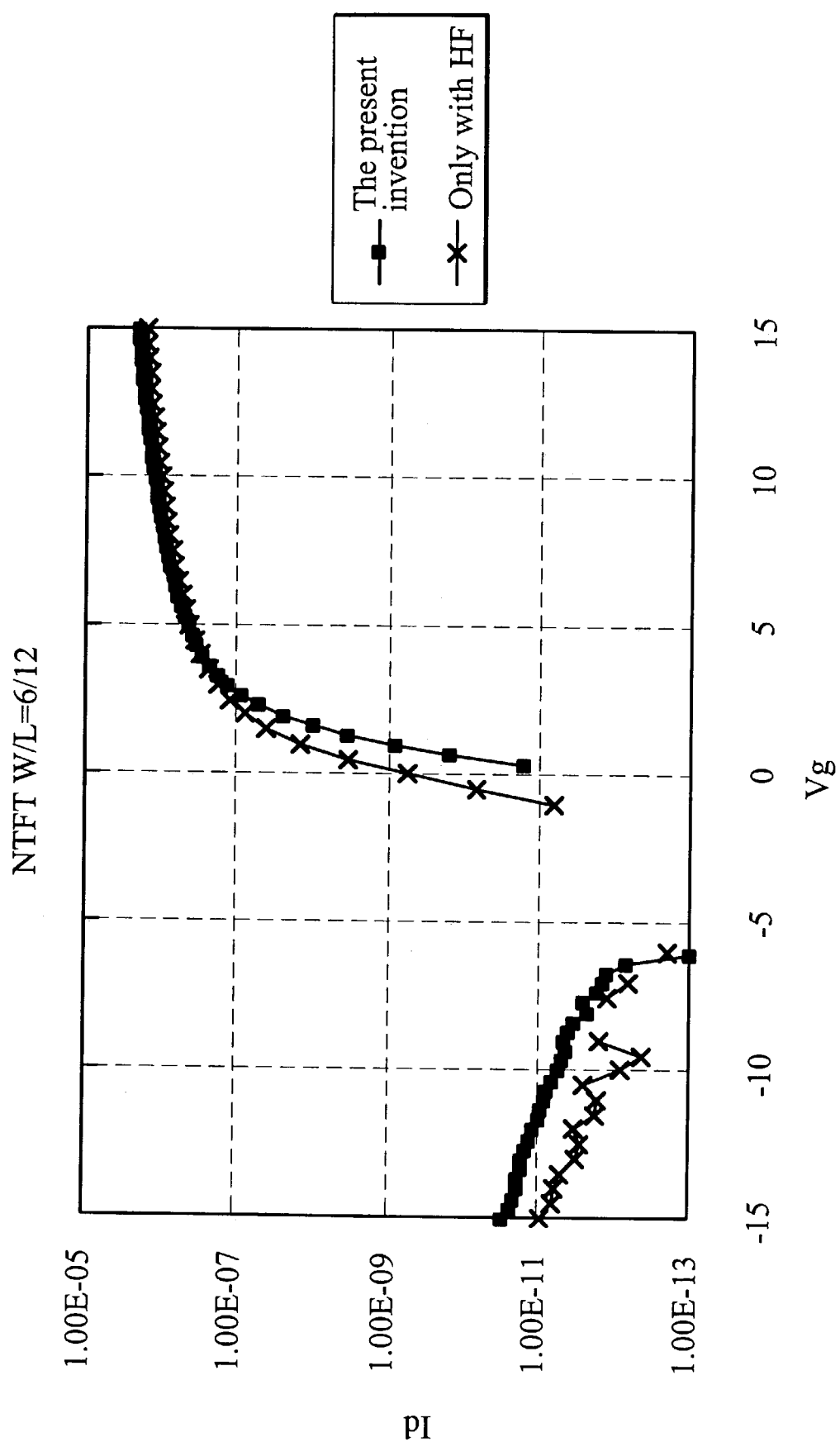
FIG. 4a shows Id-Vg diagrams of NTFT obtained by the present inventive cleaning and conventional cleaning.
Figure 4B:
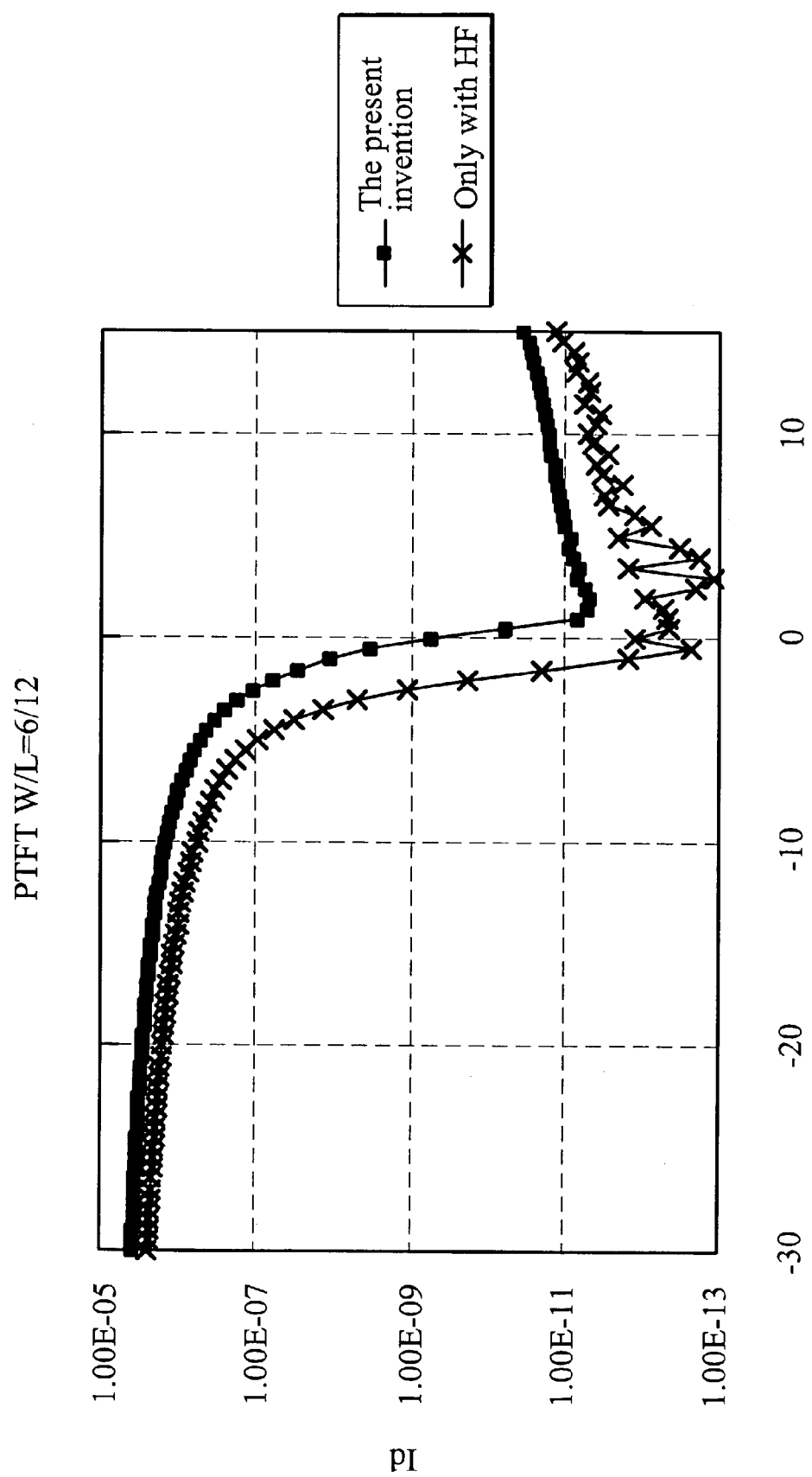
FIG. 4b shows Id-Vg diagrams of PTFT obtained by the present inventive cleaning and conventional cleaning.

The above-mentioned TFT in FIG. 2i includes NTFT and PTFT. According to similar ways, NTFT and PTFT are fabricated by conventional cleaning (only with HF). Tables 1 and 2 show electrical data of NTFT and PTFT respectively fabricated by present inventive cleaning and conventional cleaning. FIG. 4a shows Id-Vg diagrams of NTFT obtained by the present inventive cleaning and conventional cleaning, and FIG. 4b shows Id-Vg diagrams of PTFT obtained by the present inventive cleaning and conventional cleaning.

TABLE 1

Electrical data of NTFT

|  | Conventional cleaning (only with HF) | Cleaning of the present invention |
| --- | --- | --- |
| Vt (V) | 1.8 | 2.5 |
| Ufe ($cm^2$/V-s) | 65 | 120 |
| SS (mV/decade) | 0.54 | 0.44 |

TABLE 2

Electrical data of PTFT

|  | Conventional cleaning (only with HF) | Cleaning of the present invention |
| --- | --- | --- |
| Vt (V) | −5.5 | −2.27 |
| Ufe ($cm^2$/V-s) | 55 | 96 |
| SS (mV/decade) | 0.5 | 0.4 |

Vt: threshold voltage

TABLE 2-continued

Electrical data of PTFT

| | Conventional cleaning (only with HF) | Cleaning of the present invention |
|---|---|---|

Ufe: field effect mobility
SS: subthreshold swing

It can be seen from Tables 1 and 2 and FIGS. 4a and 4b that TFT fabricated by the present inventive cleaning has good electrical properties and a higher electron mobility.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for cleaning a silicon surface, the process comprising:
    cleaning a silicon surface with a first oxidant solution comprising hydrogen peroxide and 15 to 30 ppm of HCl;
    rinsing the silicon surface with HF vapor or liquid after cleaning the silicon surface;
    rinsing the silicon surface with hydrogen water or deionized water under megasonic agitation; and then
    cleaning the silicon surface with a second oxidant solution after rinsing the silicon surface with HF vapor or liquid.

2. The process as claimed in claim 1, wherein the silicon is mono-crystalline silicon wafer, amorphous silicon, or polysilicon.

3. The process as claimed in claim 1, wherein the silicon is amorphous silicon.

4. The process as claimed in claim 1, wherein the silicon is polysilicon.

5. The process as claimed in claim 1, wherein the second oxidant solution is an ozone-containing aqueous solution.

6. The process as claimed in claim 5, wherein the ozone-containing aqueous solution has a concentration of 15 to 30 ppm.

7. The process as claimed in claim 1, wherein the second oxidant solution is hydrogen peroxide ($H_2O_2$).

8. The process as claimed in claim 1, wherein the second oxidant solution includes 15 to 30 ppm of HCl.

9. The process as claimed in claim 1, wherein the HF vapor or liquid has a concentration of 0.5 to 2 weight %.

10. The process as claimed in claim 1, wherein the hydrogen water or deionized water includes an alkaline component.

11. The process as claimed in claim 10, wherein the alkaline component is $NH_4OH$.

12. A process for fabricating a thin film transistor, comprising:
    forming an amorphous silicon layer on a substrate as an active layer;
    cleaning a surface of the amorphous silicon layer, wherein the cleaning comprises:
        cleaning the amorphous silicon surface with a first oxidant solution comprising hydrogen peroxide and 15 to 30 ppm of HCl;
        rinsing the amorphous silicon surface with HF vapor or liquid after cleaning the silicon surface;
        rinsing the amorphous silicon surface with hydrogen water or deionized water under megasonic agitation; and then
        cleaning the amorphous silicon surface with a second oxidant solution after rinsing the silicon surface with HF vapor or liquid; and
    forming a gate dielectric layer, a gate, a source region, and a drain region.

13. The process as claimed in claim 12, further comprising, after the cleaning with the second oxidant solution, crystallizing the amorphous silicon layer to form a polysilicon layer as the active layer.

14. The process as claimed in claim 12, wherein the thin film transistor is a top-gate type transistor.

15. The process as claimed in claim 12, wherein the thin film transistor is bottom-gate type transistor.

16. The process as claimed in claim 12, wherein the second oxidant solution is an ozone-containing aqueous solution.

17. The process as claimed in claim 16, wherein the ozone-containing aqueous solution has a concentration of 15 to 30 ppm.

18. The process as claimed in claim 12, wherein the second oxidant solution is hydrogen peroxide ($H_2O_2$).

19. The process as claimed in claim 12, wherein the second oxidant solution includes 15 to 30 ppm of HCl.

20. The process as claimed in claim 12, wherein the HF vapor or liquid has a concentration of 0.5 to 2 weight %.

21. The process as claimed in claim 12, wherein the hydrogen water or deionized water includes an alkaline component.

22. The process as claimed in claim 21, wherein the alkaline component is $NH_4OH$.

23. The process as claimed in claim 12, wherein the process is used in fabrication of a thin film transistor-liquid crystal display (TFT-LCD).

\* \* \* \* \*